United States Patent [19]
Sauter et al.

[11] Patent Number: 5,911,461
[45] Date of Patent: Jun. 15, 1999

[54] CARRIER FOR A SEMICONDUCTOR WAFER AND USE OF THE CARRIER

[75] Inventors: Bernd Sauter, Emmerting; Dieter Seifert, Neuoetting, both of Germany

[73] Assignee: Wacker Siltronic Gesellschaft für Halbleitermaterialien AG, Burghausen, Germany

[21] Appl. No.: 08/881,560

[22] Filed: Jun. 24, 1997

[30] Foreign Application Priority Data

Jul. 31, 1996 [DE] Germany .................. 196 30 932

[51] Int. Cl.⁶ .................................................. B25J 15/00
[52] U.S. Cl. ........................ 294/1.1; 294/902; 414/941; 118/500
[58] Field of Search .................... 294/1.1, 27.1, 294/32, 34, 902; 414/935, 936, 941; 901/39; 118/500, 503; 206/710–712; 451/44

[56] References Cited

U.S. PATENT DOCUMENTS

| | | | |
|---|---|---|---|
| 3,469,686 | 9/1969 | Gutsche et al. .................. | 206/712 |
| 4,228,902 | 10/1980 | Schulte ............................ | 118/500 |
| 5,061,144 | 10/1991 | Akimoto et al. ................. | 294/32 |
| 5,401,692 | 3/1995 | Laue et al. . | |
| 5,445,486 | 8/1995 | Kitayama et al. ............... | 414/937 |
| 5,489,192 | 2/1996 | Taniguchi ........................ | 118/500 |
| 5,669,644 | 9/1997 | Kaihotsu et al. ................. | 294/1.1 |
| 5,727,990 | 3/1998 | Hasegawa et al. ............... | 451/44 |
| 5,755,469 | 5/1998 | Choi et al. ....................... | 414/941 |

FOREIGN PATENT DOCUMENTS

| | | |
|---|---|---|
| 0484290 | 5/1992 | European Pat. Off. . |
| 0665587 | 8/1995 | European Pat. Off. . |
| 2554250 | 5/1985 | France . |

*Primary Examiner*—Dean Kramer
*Attorney, Agent, or Firm*—Collard & Roe, P.C.

[57] ABSTRACT

A carrier for a semiconductor wafer has at least three protrusions on which the edge of the semiconductor wafer is supported so that the semiconductor wafer is positioned essentially horizontal. The carrier does not make contact with the front side and the rear side of the semiconductor wafer. The protrusions are shaped so that the edge of the semiconductor wafer is supported exclusively below an imaginary central plane in the center between the front side and the rear side of the semiconductor wafer. The carrier is preferably used in the treatment of semiconductor wafers at temperatures of at least 200° C.

8 Claims, 2 Drawing Sheets

CARRIER FOR A SEMICONDUCTOR WAFER AND USE OF THE CARRIER

BACKGROUND OF THE INVENTION

1. Field of the Invention

The present invention relates to a carrier for a semiconductor wafer and to the use of the carrier.

2. The Prior Art

Semiconductor wafers are produced in large numbers of pieces and are then further processed to form electronic components. The production process also comprises treatments of the semiconductor wafers at temperatures of at least 200° C. For example, there can be a pure heat treatment process. Also, there can be the deposition of layers onto the surface of the treated semiconductor wafer by thermal decomposition of deposition gases. Such treatments must strictly ensure that the semiconductor wafer is not contaminated. Contamination by undesirable foreign metals, dopants or particles whose later removal is impossible or possibly only with substantial additional expenditure, is to be avoided.

There are treatment stations, for example CVD reactors, in which semiconductor wafers are continuously treated at temperatures of at least 200° C. The semiconductor wafers are placed on a conveyor belt and are conveyed by the conveyor belt into the treatment station. Relative movements between the semiconductor wafers and the conveyor belt and the direct contact of the semiconductor wafers with the conveyor belt are to be prevented. This is because they increase the risk that the semiconductor wafers are damaged and are contaminated by foreign metals, which diffuse into the semiconductor material.

If the semiconductor wafers being coated, there is the danger that the growing layer of the coating will produce a firm joint between the semiconductor wafers and the supporting surface on which the semiconductors are resting. It is then difficult to detach an adhering semiconductor wafer from the supporting surface without at the same time damaging or contaminating the semiconductor wafer.

SUMMARY OF THE INVENTION

It is an object of the present invention to reduce the danger of damage to, or contamination of, semiconductor wafers, in particular silicon semiconductor wafers, during a treatment of the semiconductor wafers at temperatures of at least 200° C.

The above object is achieved according to the present invention by a carrier for a semiconductor wafer, which wafer has a flat front side and a flat rear side and a rounded edge connecting said front side to said rear side, and a center therebetween, wherein the carrier has at least three protrusions on which the edge of the semiconductor wafer is supported so that the semiconductor wafer ends up essentially horizontal and the carrier does not make contact with the front side and the rear side of the semiconductor wafer, and the protrusions are shaped so that the edge of the semiconductor wafer is supported exclusively below an imaginary central plane in the center of the wafer between the front side and the rear side of the semiconductor wafer.

The carrier fixes the semiconductor wafer in position and prevents the direct contact of the semiconductor wafer with a contaminated supporting surface. The danger that the semiconductor wafer may continue to adhere to the carrier, after a coating is applied to the wafer is substantially reduced by the shape of the carrier.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views:

FIG. 1b is an enlarged partial view of FIG. 1a;

DETAILED DESCRIPTION OF PREFERRED EMBODIMENTS

Figure 1A:
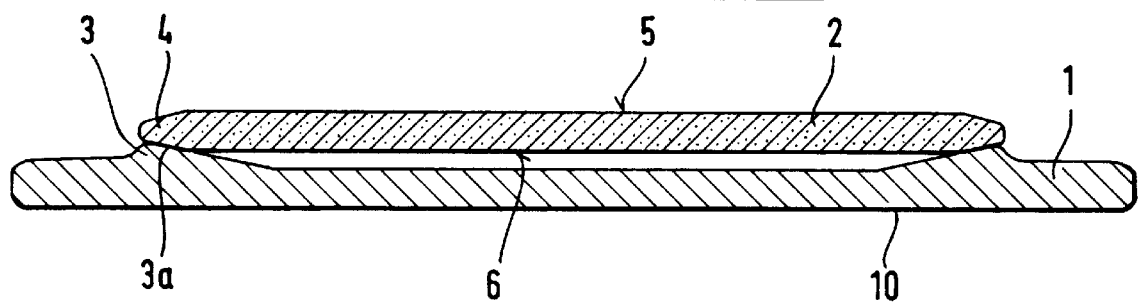
FIG. 1a diagrammatically shows a carrier according to an embodiment of the invention and a semiconductor wafer resting on the carrier in a sectional view.

Turning now in detail to the drawings, FIG. 1a shows that the shape of the carrier 1 is similar to the shape of a plate. The rounded edge 4 of the semiconductor wafer 2 rests on protrusions 3 which are provided on the carrier 1. In order to be able to keep the semiconductor wafer horizontal in a stable position, the carrier must have protrusions 3 in at least three positions which are spaced apart from one another. It is preferable that the protrusions are equally spaced apart which is about 120 degrees apart.

It is particularly preferable that the surface of the carrier is built up to form a bead 3a in the shape of a ring on which the edge 4 of the semiconductor wafer rests. The bead 3a offers a particularly large area on which the semiconductor wafer can be supported and prevents gas transport to the rear side of the semiconductor wafer.

A semiconductor wafer normally has two flat side faces which are situated parallel to one another and are adjoined by a rounded edge. In connection with the invention, that side face is described as the front side of the semiconductor wafer which points upwards away from the carrier. Correspondingly, the rear side of the semiconductor wafer is the opposite side face which points downwards towards the carrier.

Figure 1B:
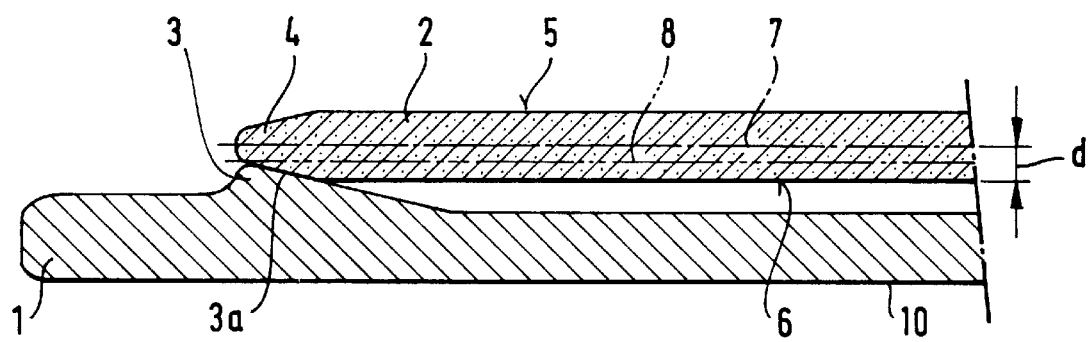

The carrier 1 does not make contact either with the front side 5 or with the rear side 6 of the semiconductor wafer 2. The protrusions 3 are shaped in such a way that the support spots with which the semiconductor wafer rests on the carrier are situated exclusively on the edge 4 of the semiconductor wafer. Specifically, the support spots or protrusions are located below an imaginary center plane 7 which is situated in the center of the wafer between the flat front side 5 and the flat rear side 6 of the semiconductor wafer as shown in FIG. 1b. The front side 5 of the semiconductor wafer can be coated in this way in a reactor without the disadvantage that the coating is impaired at the rim of the front side by the presence of the carrier.

Preferably front side 5 is parallel to the rear side 6 of the wafer, and the center plane 7 is parallel to both the front side and the rear side. Also the center plane 7 preferably bisects the distance between the front side and the rear side of wafer. Thus, center plane 7 bisects the thickness of the wafer, such that the distance d shown in FIG. 1b is equal to one-half the wafer thickness.

It is particularly preferable to form the protrusions 3 of the carrier in such a way that the edge 4 of the semiconductor wafer is supported exclusively below an imaginary plane 8. The plane 8 is parallel to and is offset with respect to the central plane 7. The distance of plane 8 from the rear side 6 of the semiconductor wafer is at most 80% of the distance d which exists between the central plane 7 and the rear side 6 of the semiconductor wafer. This is of advantage, in particular, if the semiconductor wafer is to be prevented from being joined to the carrier by a growing layer during the coating of the front side of the semiconductor wafer.

Figure 2:
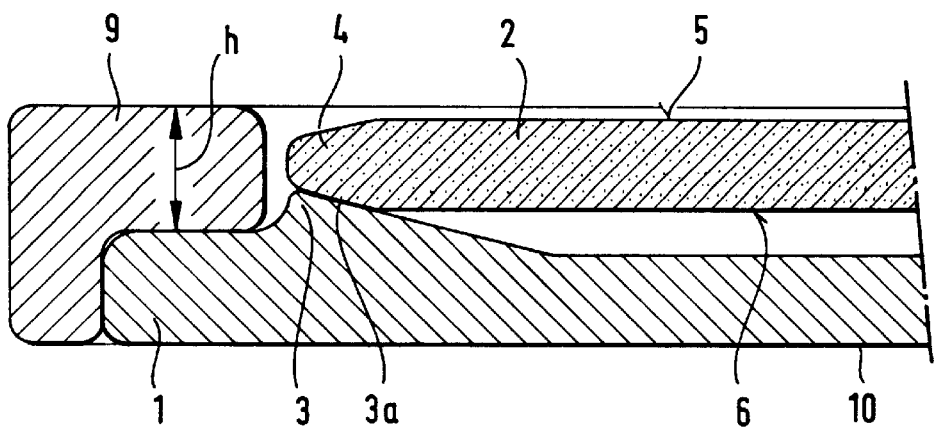
FIG. 2 shows the carrier of FIG. 1b according to another embodiment of the invention.

According to another embodiment of the invention shown in FIG. 2, the transport of deposition gas to points at which the semiconductor wafer and the carrier make contact is made difficult by a guard ring 9. The guard ring 9 extends at constant distance from the edge 4 around the horizontal semiconductor wafer. In order to limit gas transport effectively, the height h of the guard ring should be chosen so that the guard ring extends upwardly at least to the plane in which the front side 5 of the semiconductor wafer is situated.

In the embodiment shown, the guard ring is detachably joined to the carrier and can be removed before the semiconductor wafer is placed on the carrier. Also the guard ring can be lifted off the carrier using a gripping tool which preferably acts only at the edge of the semiconductor wafer. The guard ring can also be formed in such a way (not shown) that it covers the edge and in this way prevents an undesirable coating of the edge.

If the guard ring 9 and the carrier 1 are nondetachably joined, it is necessary to ensure that the gripping tool is able to place the semiconductor wafer on the protrusions 3 of the carrier. This can be done, for example, by providing the ring with recesses (not shown) which offer the gripping tool the necessary space when placing or removing the semiconductor wafer.

Figure 3:
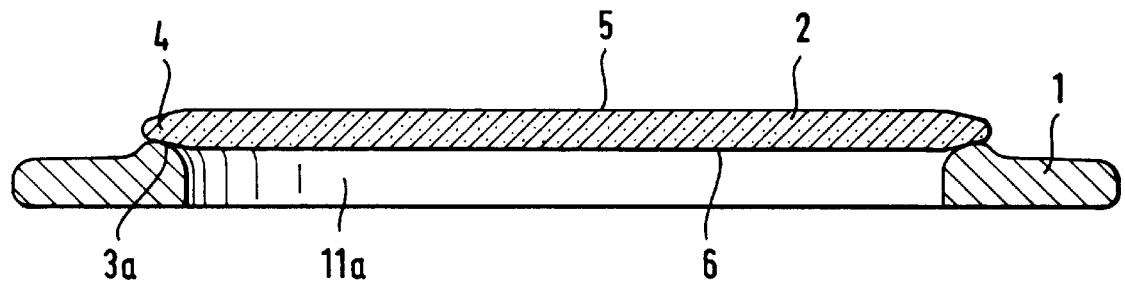
FIG. 3 shows the carrier of FIG. 1a with a cutout central opening.

As shown in FIG. 1a, the carrier 1 has the shape of a plate with a continuous base 10. The continuous base prevents, for example, deposition gas from being able to reach the rear side 6 of the semiconductor wafer. It prevents the rear side from being coated at the same time. If the rear side and the front side of the semiconductor wafer are to be treated in the same way, a cutout central hole or opening 11a, imparts the shape of a ring to the carrier. This is indicated in FIG. 3 and can be provided in the base 10 of the carrier. Opening 11a makes possible the free access to the rear side 6 of the semiconductor wafer.

Figure 4:
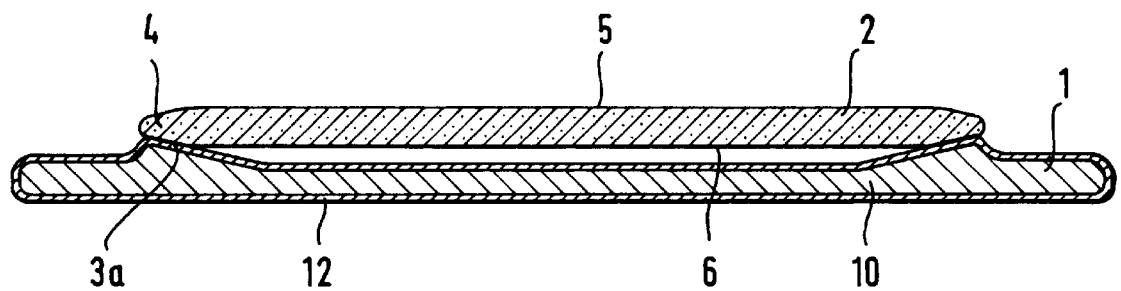
FIG. 4 shows the carrier of FIG. 1a coated with a diffusion inhibiting layer.

The carrier described is preferably used for treatments of semiconductor wafers at temperatures of at least 200° C. For the treatment of silicon semiconductor wafers, the carrier is preferably made of glass, quartz glass, ceramic or silicon. Optionally, the carrier is additionally coated with a diffusion inhibiting protective layer coating 12 as seen in FIG. 4. Layer 12 makes it almost impossible for contaminants from the supporting surface or from the carrier to be able to diffuse to the semiconductor wafer and contaminate it.

Before the treatment, the semiconductor wafer is placed on the carrier using a gripping tool. The carrier may already be situated on a conveyor belt which conveys it, together with the semiconductor wafer, into the treatment station. A plurality of carriers laden with semiconductor wafers may also be stacked one above the other in a tray and the semiconductor wafers treated jointly. A carrier and a semiconductor wafer always form a unit during the treatment of the semiconductor wafer. It is therefore expedient to clean a used carrier at regular intervals and to free it of deposited layers.

While several embodiments of the present invention have been shown and described, it is to be understood that many changes and modifications may be made thereunto without departing from the spirit and scope of the invention as defined in the appended claims.

What is claimed is:

1. A carrier in combination with a semiconductor wafer, said wafer having a flat front side and a flat rear side and a rounded edge between said front side and said rear side comprising the carrier having at least three protrusions on which the rounded edge of the semiconductor wafer is supported so that the semiconductor wafer is horizontally positioned and the carrier does not make contact with the front side and the rear side of the semiconductor wafer;

said protrusions are shaped so that the rounded edge of the semiconductor wafer is supported exclusively below an imaginary central plane of the wafer between the front side and the rear side of the semiconductor wafer; and wherein a guard ring is placed around the rounded edge of the horizontally positioned semiconductor wafer at a constant distance from the edge; and the guard ring is detachably joined to the carrier.

2. The carrier combination as claimed in claim 1, wherein the protrusions of the carrier are shaped in such a way that the rounded edge of the semiconductor wafer is supported exclusively below an imaginary plane which is in an offset manner parallel to the central plane and whose distance from the rear side of the semiconductor wafer is at most 80% of the distance which exists between the central plane and the rear side of the semiconductor wafer.

3. The carrier combination as claimed in claim 1, wherein the carrier is composed of a material which is selected from the group consisting of glass, quartz glass, ceramic and silicon.

4. The carrier as claimed in claim 1, wherein the carrier has a protective layer coating which inhibits the diffusion of contaminants.

5. In a method for the treatment of semiconductor wafers at temperatures of at least 200° C., the improvement which comprises utilizing the carrier combination of claim 1 to support a semiconductor wafer during said treatment.

6. A carrier in combination with a semiconductor wafer, said wafer having a flat front side and a flat rear side and a rounded edge between said front side and said rear side comprising the carrier having a surface which is built up to form a bead in the shape of a ring; and on said surface the rounded edge of the semiconductor wafer is supported so that the semiconductor wafer is horizontally positioned and the carrier does not make contact with the front side and the rear side of the semiconductor wafer;

said ring is shaped so that the rounded edge of the semiconductor wafer is supported exclusively below an imaginary central plane of the wafer between the front side and the rear side of the semiconductor wafer; and wherein a guard ring is placed around the rounded edge of the horizontally positioned semiconductor wafer at a constant distance from the edge; and the guard ring is detachably joined to the carrier.

7. A carrier in combination with a semiconductor wafer, said wafer having a flat front side and a flat rear side and a rounded edge between said front side and said rear side comprising the carrier being formed as a ring having a central opening and the opening makes possible free access to the rear side of the semiconductor wafer; and on said ring the rounded edge of the semiconductor wafer is supported so that the semiconductor wafer is horizontally positioned and the carrier does not make contact with the front side and the rear side of the semiconductor wafer;

said ring is shaped so that the rounded edge of the semiconductor wafer is supported exclusively below an imaginary central plane of the wafer between the front side and the rear side of the semiconductor wafer; and wherein a guard ring is placed around the rounded edge of the horizontally positioned semiconductor wafer at a constant distance from the edge; and the guard ring is detachably joined to the carrier.

8. A carrier in combination with a semiconductor wafer, said wafer having a flat front side and a flat rear side and a rounded edge between said front side and said rear side comprising the carrier being formed as a plate with a continuous base and the base covers the rear side of the semiconductor wafer completely; and on said plate the rounded edge of the semiconductor wafer is supported so that the semiconductor wafer is horizontally positioned and the carrier does not make contact with the front side and the rear side of the semiconductor wafer;

said plate is shaped so that the rounded edge of the semiconductor wafer is supported exclusively below an imaginary central plane of the wafer between the front side and the rear side of the semiconductor wafer; and wherein a guard ring is placed around the rounded edge of the horizontally positioned semiconductor wafer at a constant distance from the edge; and the guard ring is detachably joined to the carrier.

* * * * *